US011505452B2

(12) United States Patent
Natan et al.

(10) Patent No.: US 11,505,452 B2
(45) Date of Patent: Nov. 22, 2022

(54) SEMICONDUCTOR DEVICE

(71) Applicant: Amkor Technology Singapore Holding Pte. Ltd., Singapore (SG)

(72) Inventors: Lawrence Prestousa Natan, Santa Rosa (PH); Adrian Arcedera, Chandler, AZ (US); Roveluz Lledo-Reyes, Laguna (PH); Sarah Christine-Sanchez Torrefranca, Laguna (PH)

(73) Assignee: AMKOR TECHNOLOGY SINGAPORE HOLDING PTE. LTD., Singapore (SG)

(*) Notice: Subject to any disclaimer, the term of this patent is extended or adjusted under 35 U.S.C. 154(b) by 133 days.

(21) Appl. No.: 17/085,556

(22) Filed: Oct. 30, 2020

(65) Prior Publication Data

US 2021/0047173 A1 Feb. 18, 2021

Related U.S. Application Data

(63) Continuation of application No. 16/291,215, filed on Mar. 4, 2019, now Pat. No. 10,843,918, which is a continuation of application No. 15/934,267, filed on Mar. 23, 2018, now Pat. No. 10,221,064, which is a
(Continued)

(51) Int. Cl.
*B81B 7/00* (2006.01)
*B81C 1/00* (2006.01)
*G01P 1/02* (2006.01)

(52) U.S. Cl.
CPC ........ *B81B 7/0074* (2013.01); *B81C 1/00333* (2013.01); *G01P 1/023* (2013.01); *B81B 2201/0235* (2013.01); *B81B 2201/0242* (2013.01); *B81B 2201/0257* (2013.01); *B81B 2201/0278* (2013.01); *B81B 2201/0292* (2013.01); *B81B 2203/0127* (2013.01); *B81B 2203/0315* (2013.01); *B81B 2207/012* (2013.01); *B81B 2207/07* (2013.01); *B81B 2207/097* (2013.01); *B81C 2203/019* (2013.01); *B81C 2203/0792* (2013.01)

(58) Field of Classification Search
CPC .......................... B81B 7/0074; B81C 1/00309
See application file for complete search history.

(56) References Cited

U.S. PATENT DOCUMENTS

| | | |
|---|---|---|
| 6,522,762 B1 | 2/2003 | Mullenborn et al. |
| 6,686,649 B1 | 2/2004 | Mathews et al. |
| 6,781,231 B2 | 8/2004 | Minervini |

(Continued)

*Primary Examiner* — Mark V Prenty
(74) *Attorney, Agent, or Firm* — McAndrews, Held & Malloy, Ltd.

(57) ABSTRACT

A semiconductor device may include a first substrate, a first electrical component, a lid, a second substrate, and a second electrical component. The first substrate may include an upper surface, a lower surface, and an upper cavity in the upper surface. The first electrical component may reside in the upper cavity of the first substrate. The lid may cover the upper cavity and may include a port that permits fluid to flow between an environment external to the semiconductor device and the upper cavity. The second substrate may include the second electrical component mounted to an upper surface of the second substrate. The lower surface of the first substrate and the upper surface of the second substrate may fluidically seal the second electrical component from the upper cavity.

16 Claims, 8 Drawing Sheets

Related U.S. Application Data continuation of application No. 15/448,177, filed on Mar. 2, 2017, now Pat. No. 9,932,221.

(56) References Cited

U.S. PATENT DOCUMENTS

| | | |
|---|---|---|
| 7,166,910 B2 | 1/2007 | Minervini |
| 7,202,552 B2 | 4/2007 | Zhe et al. |
| 7,242,089 B2 | 7/2007 | Minervini |
| 7,381,049 B2 | 6/2008 | Li et al. |
| 7,381,589 B2 | 6/2008 | Minervini |
| 7,434,305 B2 | 10/2008 | Minervini |
| 7,439,616 B2 | 10/2008 | Minervini |
| 7,501,703 B2 | 3/2009 | Minervini |
| 7,537,964 B2 | 5/2009 | Minervini |
| 8,018,049 B2 | 9/2011 | Minervini |
| 8,030,722 B1 | 10/2011 | Bolognia et al. |
| 8,115,283 B1 | 2/2012 | Bolognia et al. |
| 9,337,354 B2 | 5/2016 | Protheroe et al. |
| 9,932,221 B1 | 4/2018 | Natan |
| 10,221,064 B2 | 3/2019 | Natan et al. |
| 10,843,918 B2 * | 11/2020 | Natan .................. B81B 7/0074 |
| 2005/0207605 A1 | 9/2005 | Dehe et al. |
| 2006/0157841 A1 | 7/2006 | Minervini |
| 2007/0018334 A1 | 1/2007 | Peytavy et al. |
| 2007/0201715 A1 | 8/2007 | Minervini |
| 2007/0215962 A1 | 9/2007 | Minervini et al. |
| 2008/0150095 A1 | 6/2008 | Yang et al. |
| 2008/0315385 A1 | 12/2008 | Gerber et al. |
| 2009/0218668 A1 | 9/2009 | Zhe et al. |

\* cited by examiner

SEMICONDUCTOR DEVICE

FIELD

Certain example embodiments of the disclosure relate to semiconductor chip packaging and packaged semiconductor devices.

BACKGROUND

Semiconductor packages are used in a wide variety of products including micro-electro mechanical systems (MEMS) devices. A MEMS device typically includes a MEMS sensor die that converts a physical phenomenon, such as pressure, acceleration, sound or light, into an electrical signal and an Application Specific Integrated Circuit (ASIC) controller die that controls operation of the MEMS sensor die.

Due to inherent difference in MEMS-based sensor stimuli, separate packaging technologies are utilized for inertial measurement (IM) sensors and environmental (ENV) sensors. An IM sensor (e.g., accelerometer, gyroscope, magnetometer, etc.) is packaged such the IM sensor is fully molded, encapsulated, or otherwise fluidically-sealed within the package since the IM sensor does not require fluidic interaction to the environment surrounding the package. However, an ENV sensor (e.g., pressure sensor, humidity sensor, temperature sensor, gas sensor, acoustic sensor, optical sensor, etc.) is packaged such the ENV sensor is not fully molded, encapsulated, or otherwise fluidically-sealed within the package since the ENV sensor requires fluidic interaction with the environment surrounding the package in order to sense various environmental properties. As such, an ENV sensor is packaged within a cavity that is fluidically exposed or otherwise has access to the air of the environment surrounding the package. Such disparate requirements of IM sensors and ENV sensors have prevented integration of such sensors in a single package platform.

Further limitations and disadvantages of conventional and traditional approaches will become apparent to one of skill in the art, through comparison of such systems with the present disclosure as set forth in the remainder of the present application with reference to the drawings.

BRIEF SUMMARY

Semiconductor packages comprising fluidically-sealed components and fluidically-exposed components are substantially shown in and/or described in connection with at least one of the figures, and are set forth more completely in the claims.

Various advantages, aspects and novel features of the present disclosure, as well as details of various illustrated example supporting embodiments, will be more fully understood from the following description and drawings.

DETAILED DESCRIPTION

Certain aspects of the disclosure relate to semiconductor packages and and/or packaged semiconductor devices. In particular, a semiconductor device may include a package, fluidically-sealable electrical components, and fluidically-nonsealable electrical components. The package may provide a structure having one or more compartments that are fluidically-sealed and one or more compartments that are fluidically-exposed. The fluidically-sealable components such as, for example, inertial measurement (IM) micro-electro mechanical systems (MEMS) devices may reside in a first compartment of the package. The package structure may fluidically-seal the first compartment and sealable components residing therein from the external environment surrounding the package structure. In this manner, the package structure may protect the components in the fluidically-sealed, first compartment from humidity, contaminants, etc. that may adversely affect the components residing therein. The fluidically-nonsealable components such as, for example, environment measurement (ENV) MEMS devices may reside in a second compartment of the package structure. In particular, the package structure may include one or more openings that fluidically-expose an interior of the second compartment and the nonsealable components residing therein to the external environment surrounding the package structure so as to enable the components residing in the fluidically-exposed, second compartment to interact with the environment.

Figure 1:
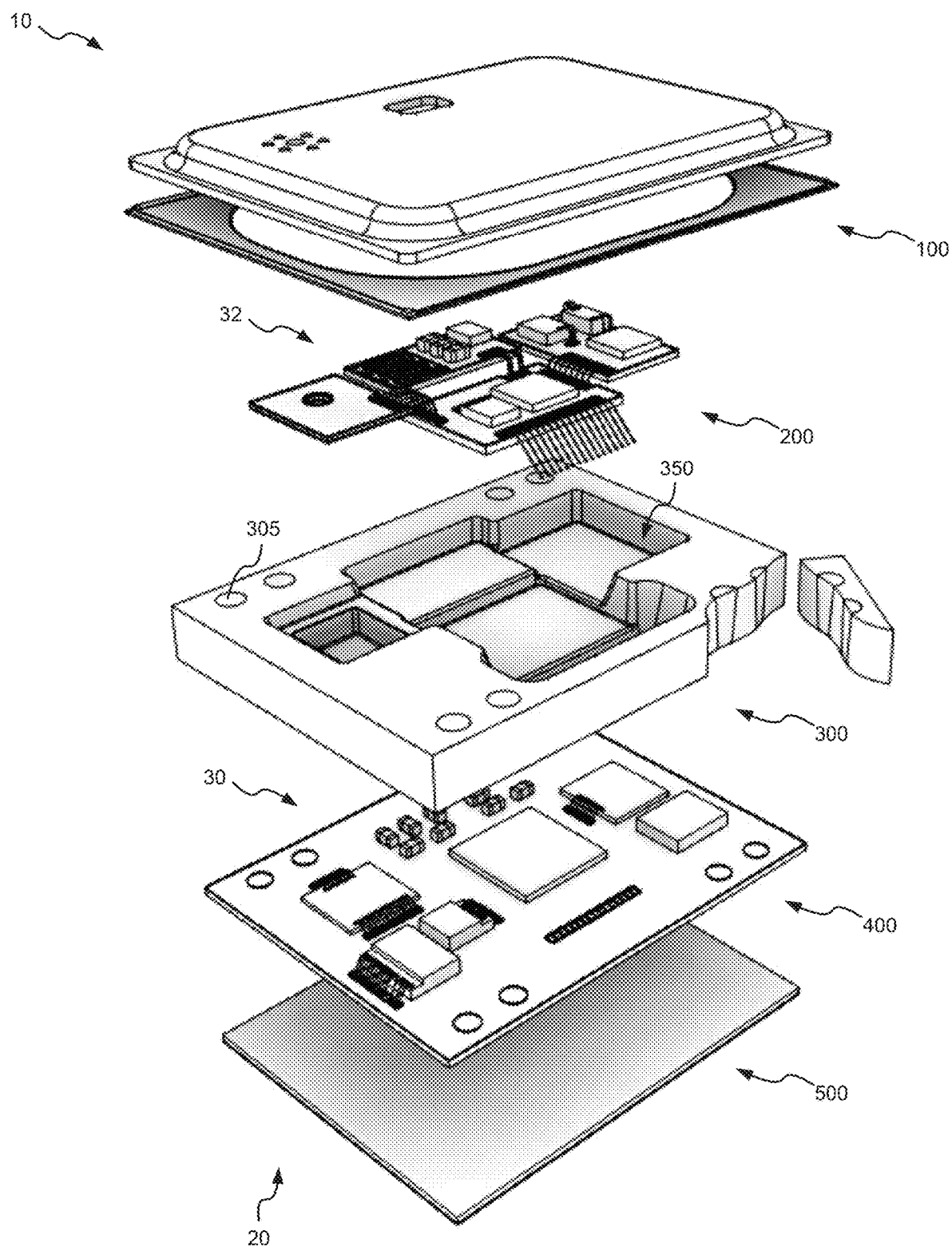
FIG. 1 depicts an exploded view a semiconductor device and its package according to an example embodiment of the present disclosure.

Referring now to FIG. 1, a semiconductor device 10, according to an example embodiment of the disclosure, is depicted in an exploded perspective view. As shown, the semiconductor device 10 may comprise a package 20 that combines, houses, and/or encloses one or more fluidically-sealable electrical components 30 and one or more fluidically-nonsealable electrical components 32. The electrical components 30, 32 may include micro-electro mechanical systems (MEMS) sensor dies, application specific integrated circuits (ASIC) controller dies, active electrical components, and passive electrical components. Moreover, the one or more fluidically-sealable components 30 may include accelerometers, gyroscopes, magnetometers, controllers, etc., which may be fully molded, encapsulated, or otherwise fluidically-sealed within the package 20 without adversely affecting the operation of such electrical components 30. Conversely, the one or more fluidically-nonsealable electrical components 32 may include pressure sensors, humidity sensors, temperature sensors, gas sensors, acoustic sensors, optical sensors, etc., which require fluidic exposure or interaction with the environment surrounding the semiconductor device 10 in order to properly sense various properties of the surrounding environment.

Figure 2:
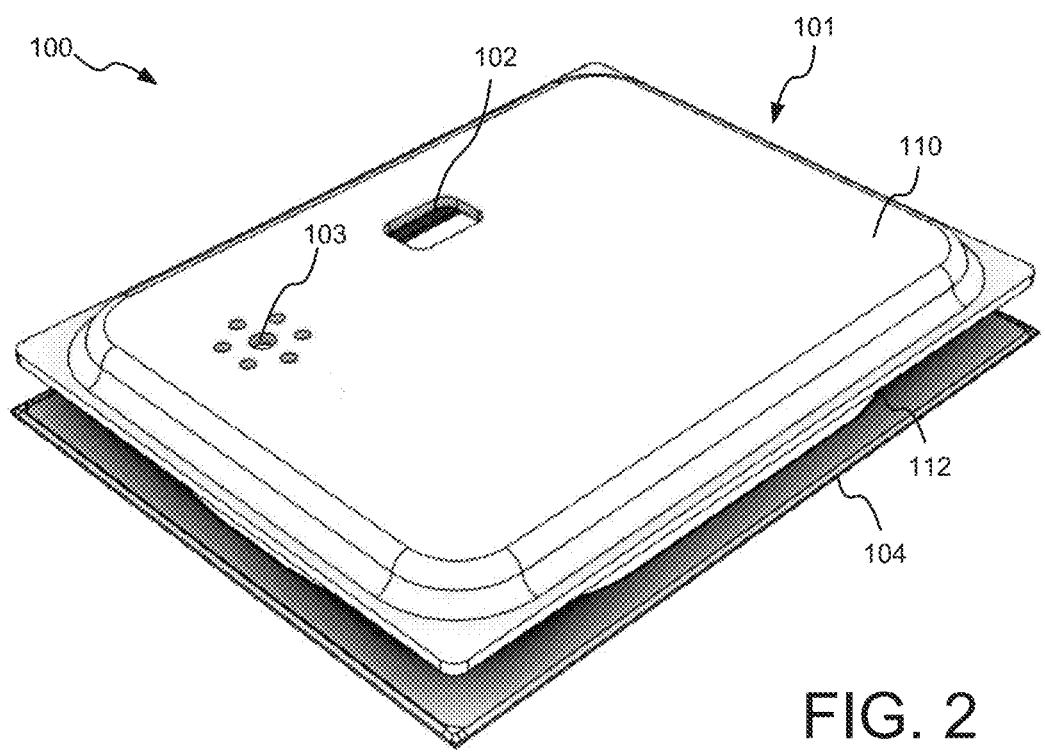
FIG. 2 depicts an example embodiment of a lid of the semiconductor device of FIG. 1.
Figure 3:
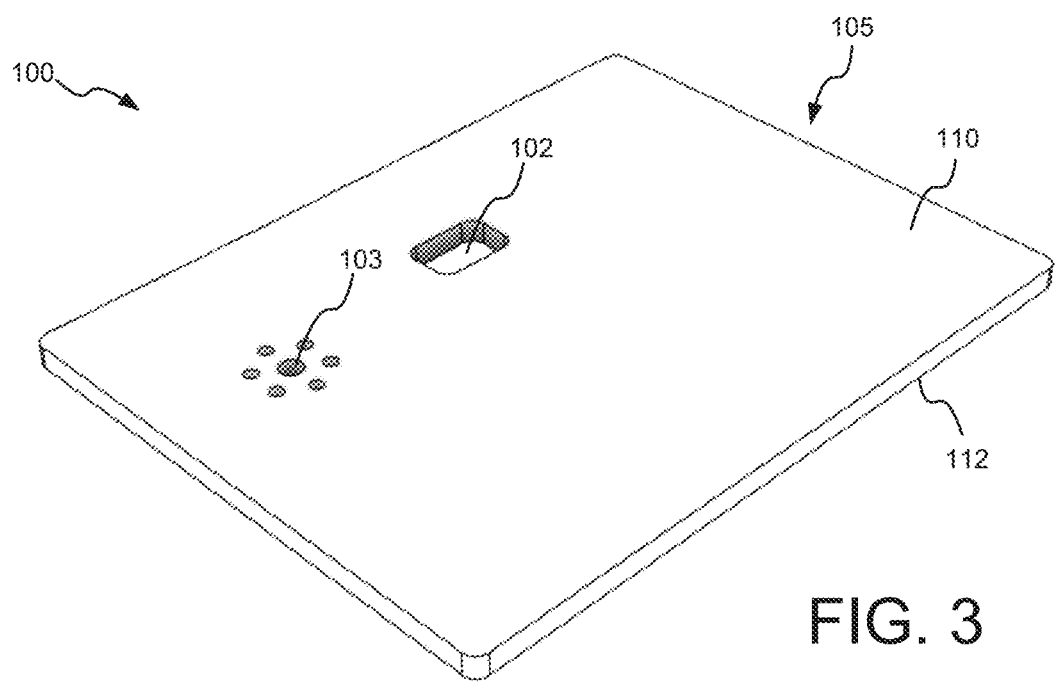
FIG. 3 depicts another example embodiment of a lid of the semiconductor device of FIG. 1.

As shown, the package 20 may include a lid 100, an interposer assembly 200, a compartmentalized substrate 300, a base substrate 400, and package input/output (I/O) 500, which collectively combine, house, and/or enclose the electrical components 30, 32 into the single, semiconductor device 10. As shown in FIG. 2, the lid 100 may comprise a stamped, metal substrate 101 having a generally, planar, rectangular-shape. In another example embodiment shown in FIG. 3, the lid 100 may comprise a polymer substrate 105 that also has a generally, planar rectangular-shape. In such an embodiment, the polymer substrate 105 may be injection-molded from a polymer material such as, for example, a liquid crystal polymer material (LCP).

Regardless of whether metal stamped or injection molded, the lid 100 may be sized to cover an upper cavity 350 of the compartmentalized substrate 300 when the lid 100 is affixed to the substrate 300. In this manner, the lid 100 may enclose components 32 within the upper cavity 350. The lid 100 may further include one or more ports 102, 103. As shown, each port 102, 103 may define an opening that passes vertically between an upper surface 110 and lower surface 112 of the lid 100. The ports 102, 103 therefore permit fluids (e.g., air, liquid, plasma, etc.) to pass between an external environment surrounding the semiconductor device 10 and the upper cavity 350 in the substrate 300 when the lid 100 is attached to the substrate 300 via an adhesive layer 104. In some embodiments, the adhesive layer 104 comprises an electrically-conductive adhesive so as to electrically couple the lid to through mold vias 305 of the compartmentalized substrate 300.

While depicted with ports 102, 103, other embodiments may include a single port or additional ports. In some embodiments, the upper cavity 350 of the compartmentalized substrate 300 may provide one or more compartments that are fluidically-divided from one another. In such embodiments, the lid 100 may include a separate port 102, 103 for each fluidically-divided compartment. Furthermore, a component 32 in the upper cavity 350 may fluidically seal a port 102, 103 from other components 32 and/or compartments. For example, the MEMS microphone subassembly 210 of FIG. 5 may include an input port 211 that is coupled to the port 103 of the lid 100 when assembled. Due to such coupling, the MEMS microphone device 210 may isolate the port 103 from the other components 32 in the upper cavity 350. In order to fluidically-expose the other components 32 to the external surroundings, the lid 10 may include the additional port 102.

Figure 4:
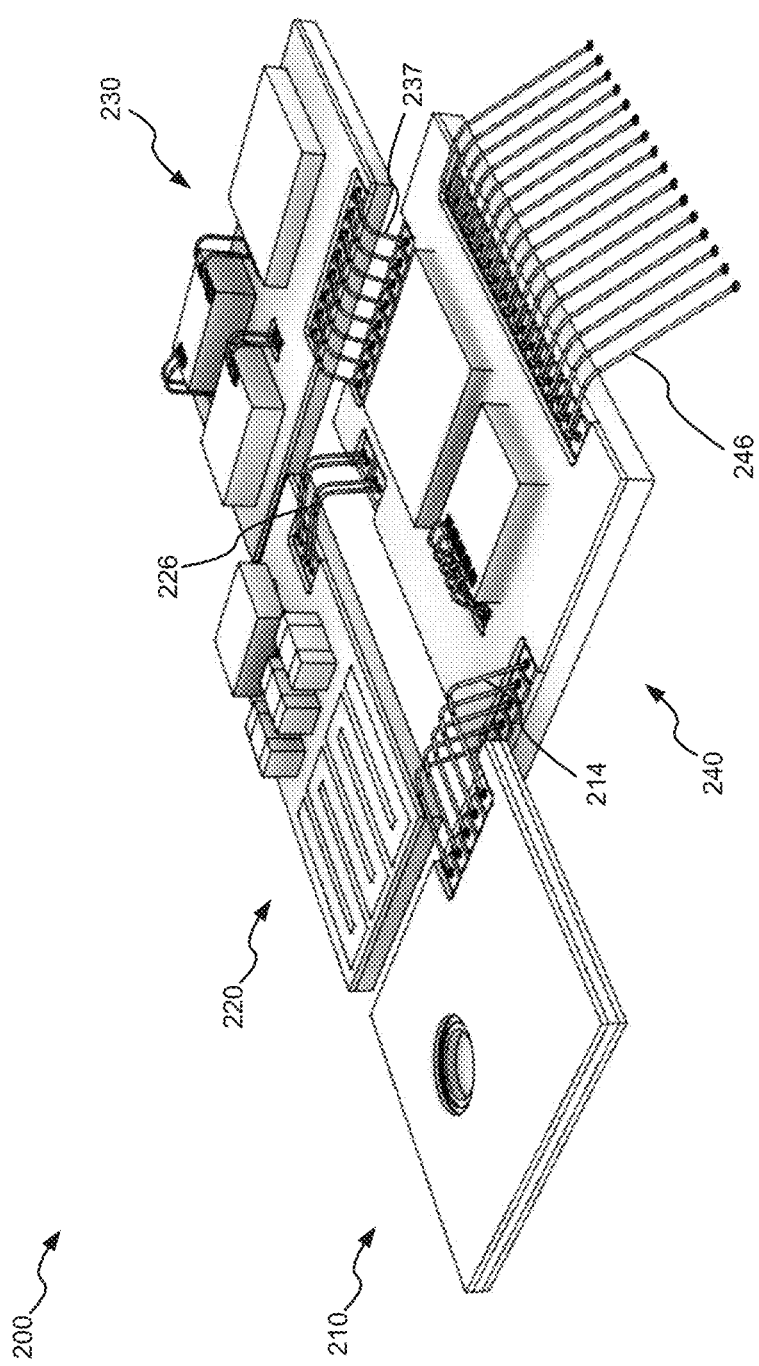
FIG. 4 provides a perspective view of an example interposer assembly of the semiconductor device of FIG. 1.

Referring now to FIG. 4, an example embodiment of the interposer assembly 200 is shown in greater detail. In general, the interposer assembly 200 provides an electrical interface that spreads or reroutes electrical connections between components attached to the interposer assembly 200 and electrical connections of the base substrate 300. As shown, the interposer assembly 200 may comprise four interposer subassemblies 210, 220, 230, and 240 that are operably interconnected via wires 214, 226, and 237. The interposer assembly 200 further includes wires 246 that operably couple the interposer assembly 200 to the base substrate 400. For the sake of discussion, specific embodiments of the subassemblies 210, 220, 230, and 240 are described. However, in some embodiments of the semiconductor device 10, the interposer assembly 200 may include a single assembly, a different number of subassemblies, and/or a different mix of sensors than those described.

Figure 5:
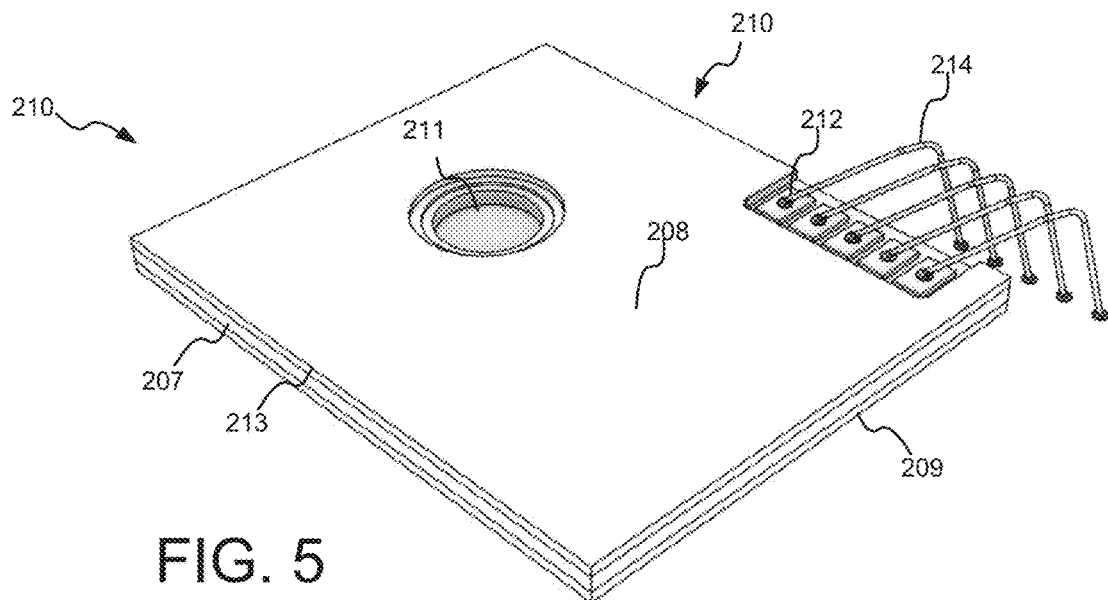
FIG. 5 provides a top perspective view of an example microphone subassembly from the interposer assembly of FIG. 4.
Figure 6:
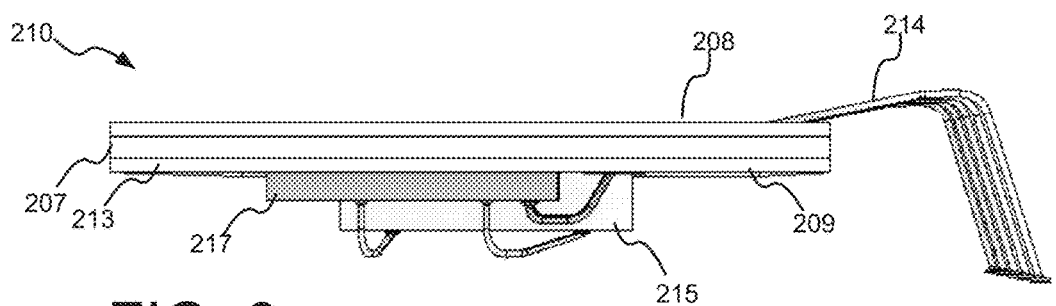
FIG. 6 provides a side view of the microphone subassembly of FIG. 5.
Figure 7:
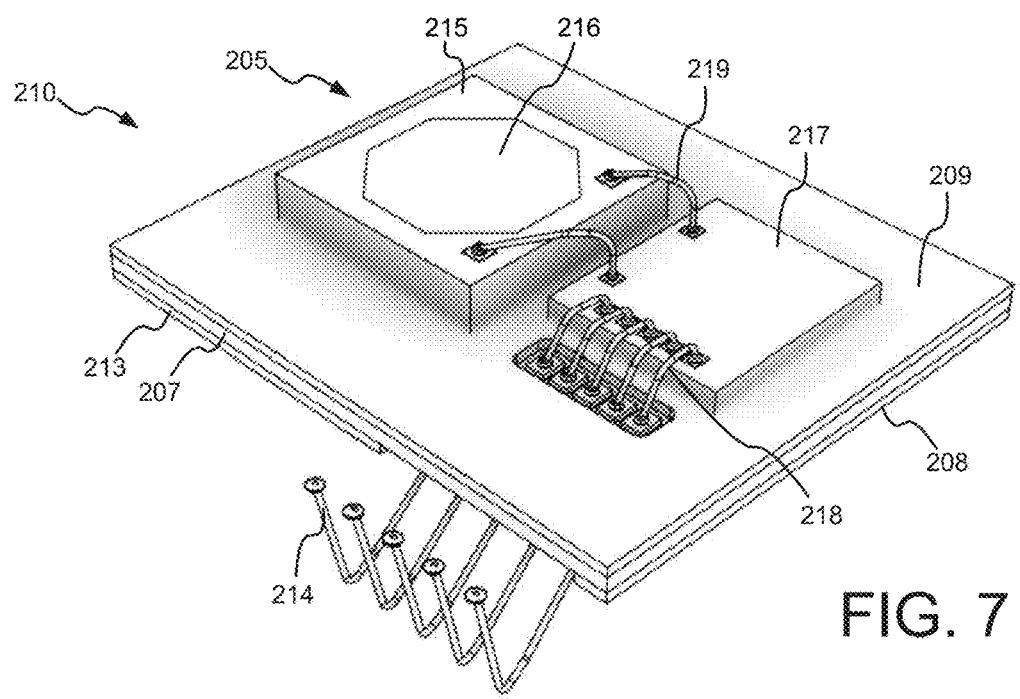
FIG. 7 provides a bottom perspective view of the microphone subassembly of FIG. 5.

Referring now to FIGS. 5-7, an example embodiment of the first interposer subassembly 210 is shown. As shown, the first interposer subassembly 210 may be a MEMS microphone subassembly. In such an embodiment, the interposer subassembly 210 may comprise a MEMS microphone device 205 operably coupled to metal traces 207 of a multilayer substrate 213. As shown, an upper surface 208 of the multilayer substrate 213 may include a MEMS microphone port 211, which may be coupled to or otherwise aligned with the port 103 in lid 100 when assembled. The upper surface 208 may further include wirebond pads 212 that provide an interface to the metal traces 207 of the multilayer substrate 213. Interposer wires 214 are coupled to the wirebond pads 212 in order to operably couple components (e.g., the MEMS transducer die 215 and/or ASIC die 217) of the first interposer subassembly 210 to the fourth interposer subassembly 240 via the metal traces 207 of the substrate 213.

As shown in FIGS. 6 and 7, the MEMS transducer die 215 and the ASIC controller die 217 may be mounted to a lower surface 209 of the multilayer substrate 213. Bonding wires 218 may couple the ASIC controller die 217 to metal traces 207 of the multilayer substrate 213. Similarly, bonding wires 219 may couple the MEMS transducer die 215 to the ASIC controller die 217. Moreover, the MEMS transducer die 215 may further include a MEMS diaphragm 216. The MEMS transducer die 215 and MEMS diaphragm 216 may align with and seal the port 211.

Due to such configuration, sound waves, received via the port 103 and port 211, may impinge upon the MEMS diaphragm 216 and may cause the MEMS diaphragm 216 to vibrate. The MEMS transducer die 215, in response to such vibrations of the MEMS diaphragm 216, may generate electrical signals and deliver such electrical signals to the ASIC controller die 217 via bond wires 219. The ASIC controller die 217 may process the received electrical signals and provide, to the fourth interposer subassembly 240 via the bond wires 218, analog and/or digital signals that are representative of the received sound waves.

Figure 8:
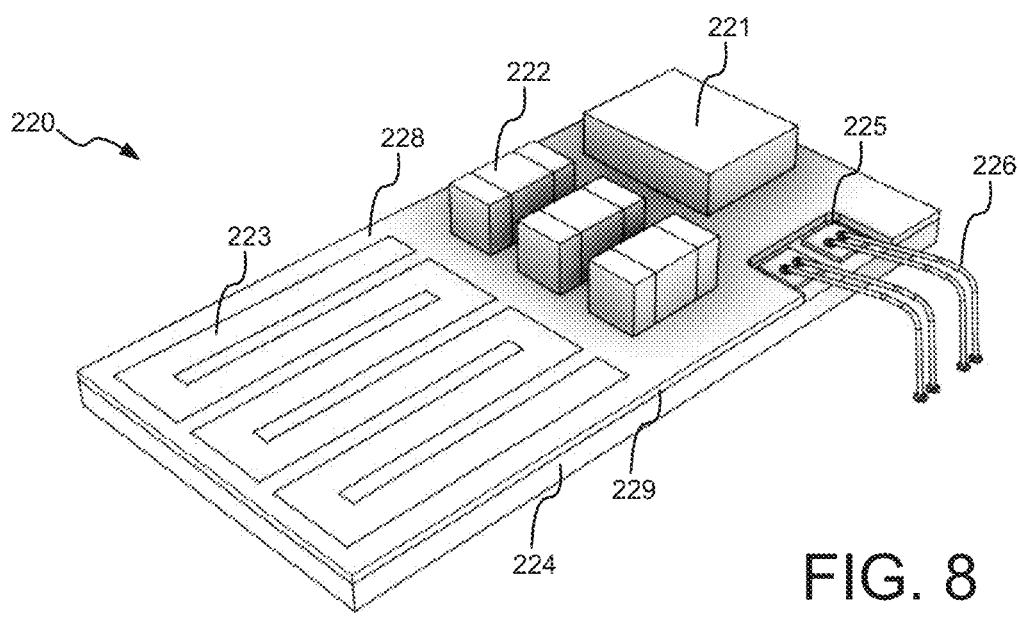
FIG. 8 provides a perspective view of an example MEMS sensor subassembly from the interposer assembly of FIG. 4.

Referring now to FIG. 8, an example embodiment of the second interposer subassembly 220 is shown. As shown, the second interposer subassembly 220 may be a light-emitting diode (LED)/Optical MEMS sensor subassembly. In such an embodiment, the interposer subassembly 220 may comprise a LED/Optical MEMS sensor die 221, surface mount devices 222, and embedded devices 223 operably coupled to metal traces 229 of a multilayer substrate 224. As shown, the MEMS sensor die 221, the surface mount devices 222, and the embedded devices 223 may be coupled or otherwise mounted to an upper surface 228 of the multilayer substrate 224. The upper surface 228 may further include wirebond pads 225 that provide an interface to the metal traces 229 of the multilayer substrate 224. Interposer wires 226 are coupled to the wirebond pads 225 in order to operably couple the MEMS sensor die 221, the surface mount devices 222, and the embedded devices 223 to the fourth interposer subassembly 240 via the metal traces 229 of the multilayer substrate 224.

The LED/Optical MEMS sensor die 221 may be configured to detect light received via the port 102 in the lid 100. The surface mount devices 222 may include passive devices such as resistors and capacitors, which aid the LED/Optical MEMS sensor die 221 to generate electrical signals that are indicative of the detected light. Similarly, the embedded devices 223 may include inductive coils and/or resistors embedded in the multilayer substrate 224, which aid the LED/Optical MEMS sensor die 221 to generate electrical signals that are indicative of the detected light. Such electrical signals may be provided to the fourth subassembly 240 via the metal traces 229 of the substrate 224 and the bond wires 226 coupled to pads 225.

Figure 9:
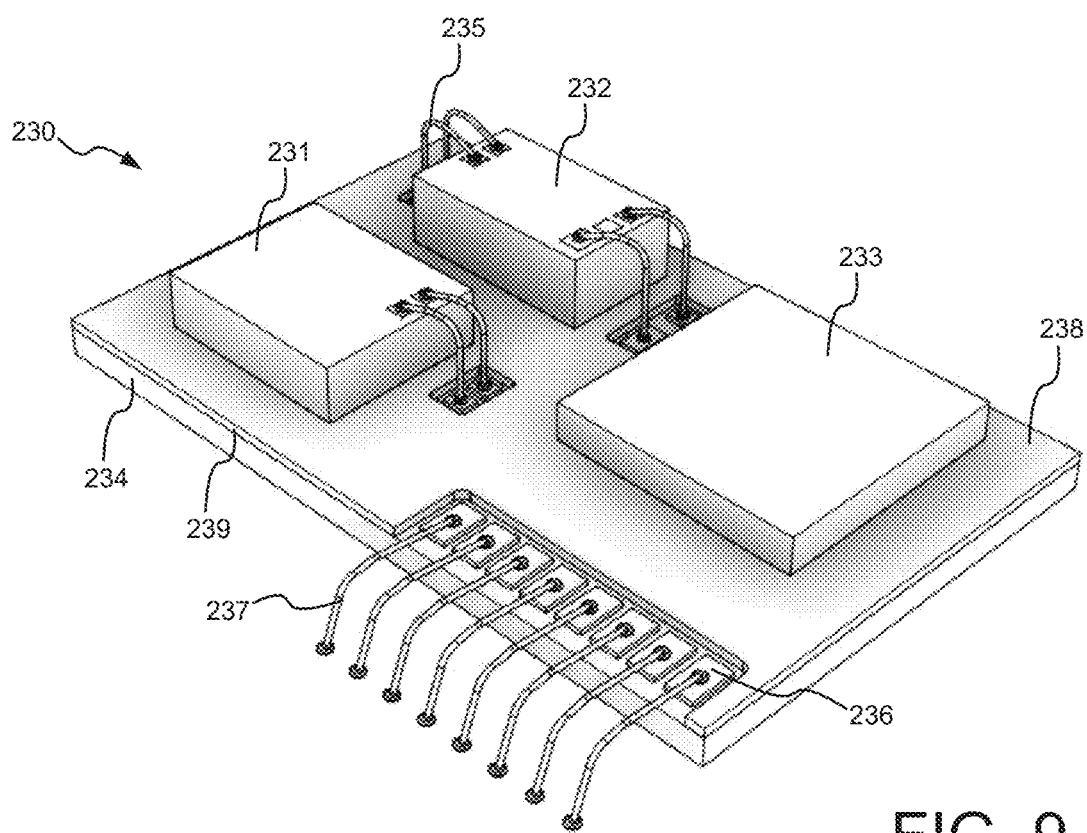
FIG. 9 provides a perspective view of another example MEMS sensor subassembly from the interposer assembly of FIG. 4.

An example embodiment of the third interposer subassembly 230 is shown in FIG. 9. As shown, the third interposer subassembly 230 may be an environment sensor assembly configured to detect one or more environmental properties such as humidity, temperature, and/or gas. In such an embodiment, the interposer subassembly 230 may comprise a first MEMS sensor die 231, a second MEMS sensor die 232, and an ASIC controller die 233 operably coupled to metal traces 239 of a multilayer substrate 234. As shown, the first MEMS sensor die 231, the second MEMS sensor die 232, and the ASIC controller die 233 may be coupled or otherwise mounted to an upper surface 238 of the multilayer substrate 234. The upper surface 238 may further include wirebond pads 236 that provide an interface to the metal traces 239 of the multilayer substrate 234. Interposer wires 237 are coupled to the wirebond pads 236 in order to operably couple the first MEMS sensor die 231, the second MEMS sensor die 232, and/or the ASIC controller die 233 to the fourth interposer subassembly 240 via the metal traces 239 of the substrate 234.

The first MEMS sensor die 231 may be configured to sense one or more environmental properties (e.g., humidity, temperature, etc.) of a fluid (e.g., air, gas, liquid) received via the port 102 in the lid 100. The second MEMS sensor die 232 may be configured to sense one or more other environmental properties (e.g., gas, contaminants, etc.) of a fluid (e.g., air, gas, liquid) received via the port 102 in the lid 100. In light of such sensing, the MEMS sensor dies 231, 232 are configured to generate electrical signals indicative of the sensed environmental properties and provide such signals to the ASIC controller die 233 via bond wires 235 and metal traces 239 of the multilayer substrate 234. The ASIC controller die 233 is configured to process the electrical signals received from the MEMS sensor dies 231, 232 and provide processed signals to the fourth interposer assembly 240 via interposer wires 237.

Figure 10:
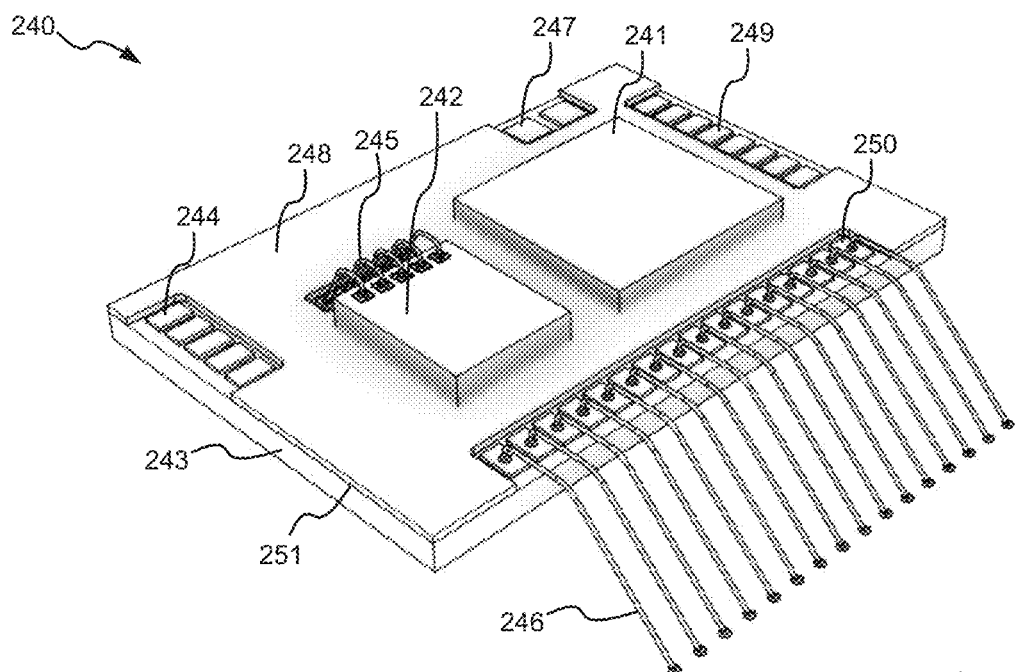
FIG. 10 provides a perspective view of yet another example MEMS sensor subassembly from the interposer assembly of FIG. 4.

An example embodiment of the fourth interposer subassembly 240 is shown in FIG. 10. As shown, the fourth interposer subassembly 240 may be an environment sensor subassembly similar to the third interposer subassembly 230. As such, the fourth interposer subassembly 240 may be configured to detect one or more environment properties such as humidity, temperature, and/or gas. In such an embodiment, the interposer subassembly 240 may comprise a microcontroller die 241 and a MEMS sensor die 242 operably coupled to metal traces 251 of a multilayer substrate 243. As shown, the microcontroller die 241 and the MEMS sensor die 242 may be coupled or otherwise mounted to an upper surface 248 of the multilayer substrate 243. The upper surface 248 may further include four sets of interposer bond pads 244, 247, 249, 250 that provide an interface to the metal traces 251 of the multilayer substrate 243. Interposer wires 246 are coupled to the wirebond pads 250 in order to operably couple the microcontroller die 241 and the MEMS sensor die 242 to the base substrate 300 via the metal traces 251 of the substrate 243.

The MEMS sensor die 242 may be configured to sense one or more environment properties (e.g., humidity, temperature, gas, contaminants, etc.) of a fluid (e.g., air, gas, liquid) received via the port 102 in the lid 100. In response to such sensing, the MEMS sensor die 242 is configured to generate electrical signals indicative of the sensed environment properties and provide such signals to the microcontroller die 241 via bond wires 245 and metal traces 251 of the multilayer substrate 243. The microcontroller die 241 is configured to process the electrical signals received from the MEMS sensor die 242 and provide processed signals to the base substrate 300 via interposer wires 246.

Figure 11:
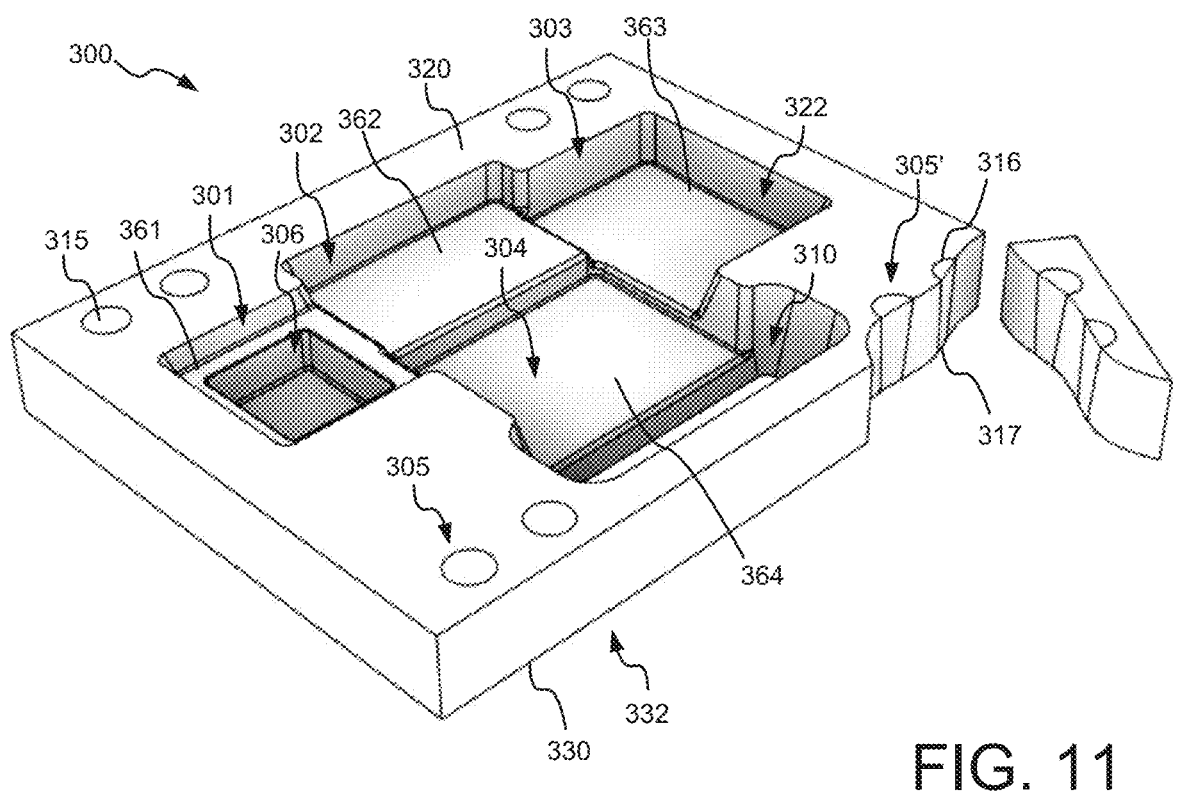
FIG. 11 provides a perspective view of a compartmentalized substrate of the semiconductor device of FIG. 1.

Referring now to FIG. 11, an example embodiment of the compartmentalized substrate 300 is shown. The compartmentalized substrate 300 may have a rectangular form and may be formed through injection-molding, for example, using an inexpensive polymer material. In particular, the compartmentalized substrate 300 may include an upper surface 320 having an upper cavity 322 and a lower surface 330 having a lower cavity 332. The upper cavity 322 may be defined by one or more compartments 301, 302, 303, 304 that are sized to receive a respective interposer assembly 210, 220, 230, 240. Similarly, the lower cavity 332 may be sized to receive components 30 mounted to the base substrate 400. In some embodiments, the compartmentalized substrate 300 formed or molded directly onto the base substrate 400 and components 30. In such embodiments, the lower cavity 332 may not be pre-defined, but formed as a result of forming and/or molding the compartmentalized substrate 300 on the base substrate 400.

As shown, the compartmentalized substrate 300 may further include a vertical pass-through 310 which is aligned with bond pads 408 of the base substrate 400 when assembled. See, e.g., FIG. 12. The vertical pass-through 310 may permit interposer wires 246 to electrically couple the interposer assembly 200 to the base substrate 400 via the bond pads 408.

When mounted to the base substrate 400, the compartmentalized substrate 300 may circumscribe the bond pads 408 and components 30 mounted to the base substrate 400 such that a seal is formed between the lower surface 330 of the compartmentalized substrate 300 and an upper surface 411 of the base substrate 400. In this manner, the compartmentalized substrate 300 and base substrate 400 may fluidically seal components 32 mounted to the base substrate 400 from the compartments 301, 302, 303, 304 and the environment surrounding the semiconductor device 10.

In some embodiments, the compartmentalized substrate 300 may be injection-molded using a polymer material. Such injection-molding may form the compartmentalized substrate 300 such that compartmentalized substrate 300 includes thru-mold vias 305 that pass between the upper surface 320 and the lower surface 330. In other embodiments, the compartmentalized substrate 300 may be formed with grooves formed on an outer side surface of the compartmentalized substrate 300. In such an embodiment, the grooves may form a structure similar to the cut-away view of the via 305' shown FIG. 11. Regardless, the formed vias and/or grooves 305, 305' may be plated or otherwise filled with a conductive material to provide ground traces 315, which ground the lid 100 to the package I/O 500. To this end, an upper end 316 of the ground traces 315 may be electrically coupled to the lid 100 when the lid 100 is affixed to the compartmentalized substrate 300 via an adhesive of other fixing agent. The lower end 317 of the ground traces 315 may be electrically coupled to the solder or ground pads 409 of the base substrate 400 when the compartmentalized substrate 300 is affixed to the base substrate 400 via adhesives, potting material, solder, and/or fixing agents such as screws.

As shown in FIGS. 1 and 11, each of the compartments 301, 302, 303, 304 is sized to accommodate a respective interposer subassembly 210, 220, 230, 240. Moreover, each of compartments 301, 302, 303, 304 may collectively define the upper cavity 322 in the upper surface 320 of the compartmentalized substrate 300. Each compartment 301, 302, 303, 304 may further provide a mounting surfaces 361, 362, 363, 364 upon which each of the interposer subassemblies 210, 220, 230, 240 may rest. Moreover, each of the mounting surfaces 361, 362, 363, 364 may extend to a depth that accommodates its respective subassembly 210, 220, 230, 240. As such, each of the mounting surfaces 361, 362, 363, 364 may be positioned at a different depth. Such differences in depth may provide horizontal barriers, which may help prevent lateral shifting of the respective subassemblies 210, 220, 230, 240 within their respective compartments 301, 302, 303, 304. As such, the subassemblies 210, 220, 230, 240 may closely mate with the compartments 301, 302, 303, 304, mounting surfaces 361, 362, 363, 364, and lid 100 to an extent that the subassemblies 210, 220, 230, 240 may be simply placed within their respective compartments 301, 302, 303, 304 without further affixing of the subassemblies 210, 220, 230, 240 to the compartmentalized substrate 300. In other embodiments, the subassemblies 210, 220, 230, 240 may be affixed to the compartmentalized substrate 300 via adhesives, potting material, solder, and/or fixing agents such as screws.

As shown, the mounting surfaces 361, 362, 363, 364 are not necessary planar. In particular, FIG. 11 depicts that the mounting surface 361 may include a cavity 306. In one embodiment, the cavity 306 provides a backing volume to the MEMS diaphragm 216. The increased volume provided by the cavity 306 may improve the operational performance of the MEMS microphone subassembly 210.

Figure 12:
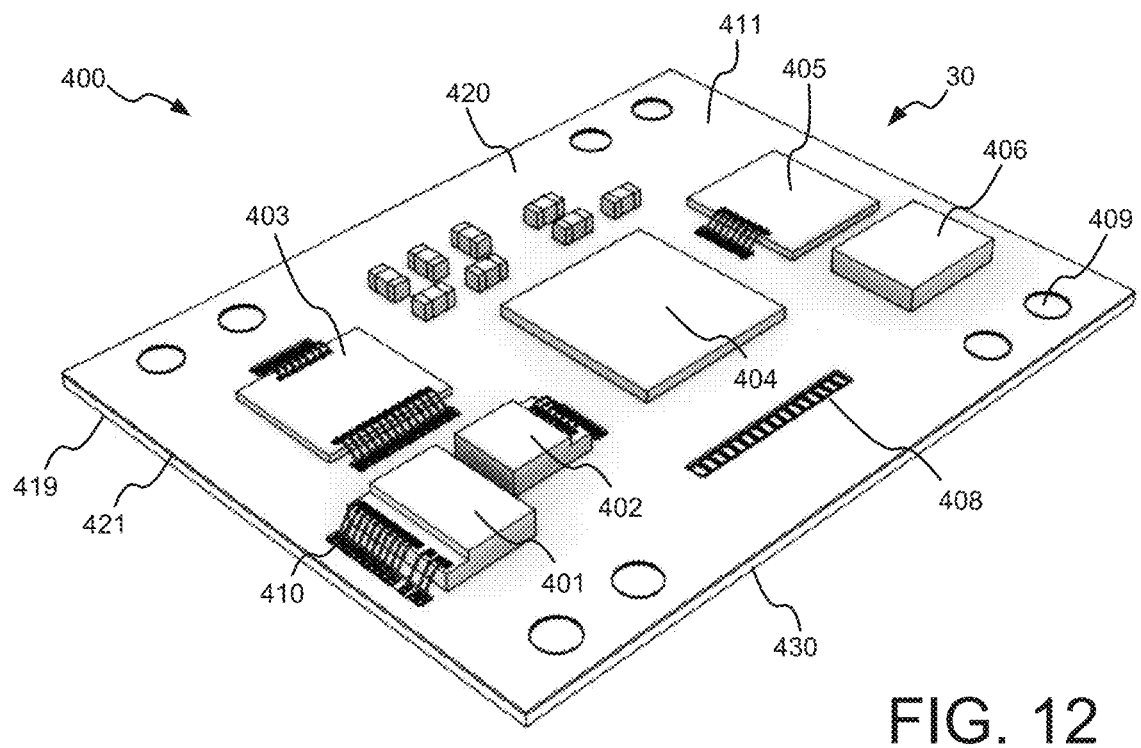
FIG. 12 provides a perspective view of a base substrate of the semiconductor device of FIG. 1.

Referring now to FIG. 12, the base substrate 400 may comprise a rectangular-shaped, multilayer substrate 419 with metal traces 421. The multilayer substrate 419 may comprise an upper surface 420 providing mounted components 30 and a lower surface 430 providing the package I/O 500. The compartmentalize substrate 300 of the package 20 may isolate, enclose, or otherwise fluidically-seal the upper surface 420 from the external environment surrounding the semiconductor device 10. As such, one or more fluidically-sealable electrical components 30 may be mounted to the upper surface 420 in order to fluidically-seal such components 30 from the surrounding environment. In this manner, the package 20 may protect such fluidically-sealable electrical components 30 from environmental aspects (e.g., humidity, contaminants, gases, etc.), which may adversely affect their operation and/or longevity.

As shown, the multilayer substrate 419 may be populated with various sealable electrical components 30. In particular, the electrical components 30 may include a first MEMS sensor die 401 (e.g., a gyroscope), a second MEMS sensor die 402 (e.g., an accelerometer), and a third MEMS sensor die 405 (e.g., a magnetometer). The electrical components 30 may further include a first ASIC die 403, a second ASIC die 404, a power management module 406, and passive components 407 (e.g., surface mount technology (SMT) resistors and/or capacitors). The example embodiment depicted in FIG. 12 includes three sensor dies 401, 402, 405, two ASIC dies 403, 405, a power management modules 406, and passive components 407. Other embodiments of the base substrate 400 may lack one or more of the depicted components 30 and/or may comprise a different number of such components.

The sealable MEMS sensor dies 401, 402, 405 may convert phenomenon, such as acceleration, magnetic fields, etc. that may be sensed despite being fluidically sealed from the surrounding environment. The ASIC dies 403, 404, and 406 may control the operation of respective MEMS sensor dies 401, 402, 405. The power management module 406 may condition and distribute power to the various components of the semiconductor device 10. Furthermore, the passive components 407 may provide electrical interfacing and may condition signals propagating among the various sensor dies 401, 402, 405, ASIC dies 403, 404, 406, interposer subassemblies 210, 220, 230, 240, and package I/O 500.

Besides metal traces 421, the multilayer substrate 419 may further include bond pads 408, and solder or ground pads 409. The metal traces 421 may include one or more conductive trace layers, which electrically interconnect the various components 401-407, pads 408, 409, and bond wires 410 mounted to the multilayer substrate 421. The bond pads 408 provide an interface to the metal traces 421 of the base substrate 400. Moreover, interposer wires 246 may electrically couple the interposer assembly 200 to the metal traces 421 of the base substrate 400 via the bond pads 408.

The base substrate 400 may be configured such that one or more terminals of the package I/O 500 are electrically coupled to the solder pads 409 and the metal traces 421 of the base substrate 400. As shown, in FIGS. 13-15, the package I/O 500 may be implemented using various interconnect options, which provide a plurality of terminals such as I/O terminals, power terminals, and/or ground terminals. While a few different interconnect options are depicted and discussed, other embodiments may use different interconnect options without departing from certain aspects of the disclosure and appended claims.

Figure 13:
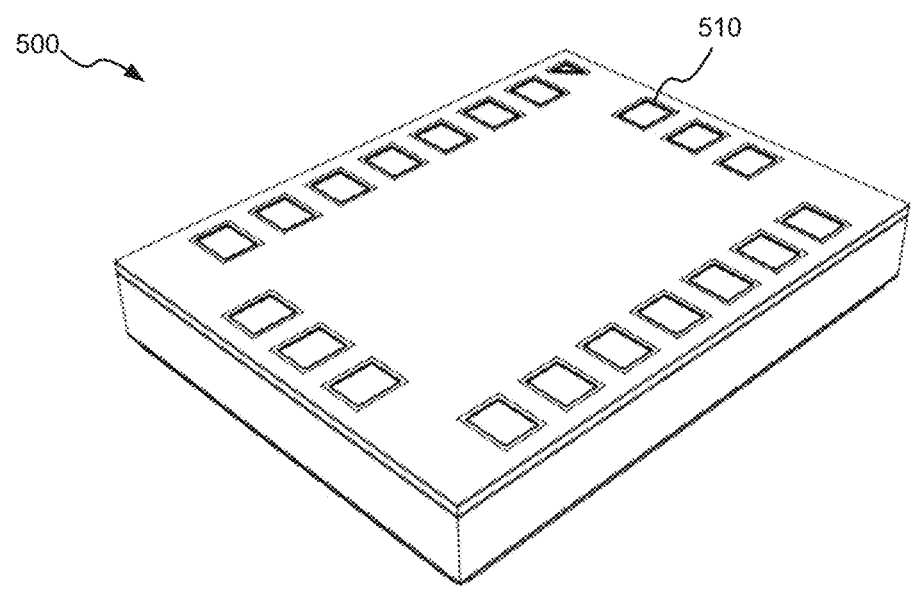
FIG. 13 provides a perspective view of a land grid array (LGA) I/O package of the semiconductor device of FIG. 1.

For example, the package I/O 500 may be implemented as a land grid array (LGA) comprising a plurality of flat conductive contacts or terminals 510 as shown in FIG. 13. The flat conductive contacts 510 of the LGA may permit connecting the semiconductor device 10 to an LGA socket of a printed circuit board (PCB) or surface mounting the semiconductor device 10 by directly soldering the flat conductive contacts 510 to a grid of contacts on the surface of the PCB.

Figure 14:
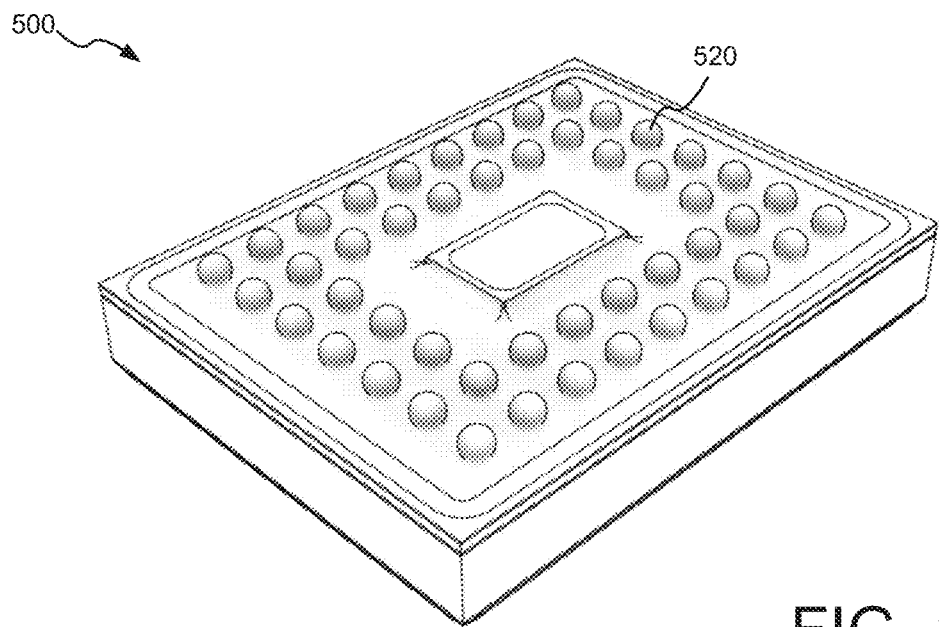
FIG. 14 provides a perspective view of a ball grid array (BGA) I/O package of the semiconductor device of FIG. 1.

As shown in FIG. 14, the package I/O 500 may also be implemented as a ball grid array (BGA) comprising a plurality of solder balls or terminals 520. The solder balls 520 may permit surface mounting the semiconductor device 10 to a PCB by reflowing or heating the solder balls 520 such that the solder balls 520 adhere to corresponding pads of the PCB.

Figure 15:
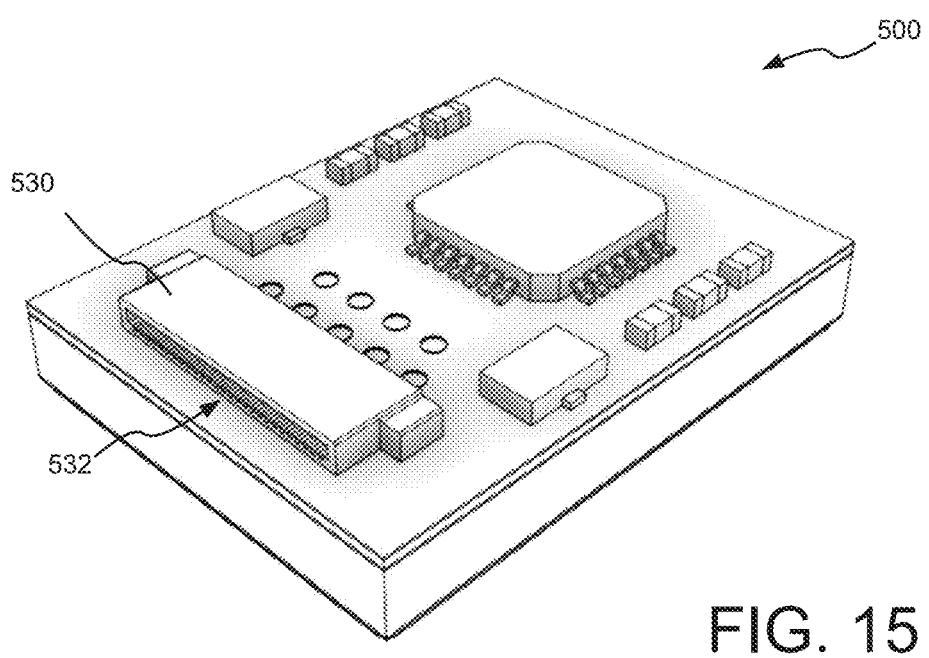
FIG. 15 provides a perspective view of a flex connector I/O package of the semiconductor device of FIG. 1.

In yet another example embodiment, the package I/O 500 may include a flex connector 530 as shown in FIG. 15. The flex connector 530 may comprises a female receptacle 532. The flex connector 530 may comprising a plurality of terminals that electrically couple the semiconductor device 10 to a PCB via a flexible, ribbon cable received by the female receptacle 532.

While various aspects supporting the disclosure have been described with reference to certain example embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular example embodiments disclosed, but that the present disclosure will include all embodiments falling within the scope of the appended claims.

What is claimed is:

1. A semiconductor device, comprising:
   a substrate comprising a substrate top side, a substrate bottom side, and one or more conductive paths;
   an electrical component mounted to the substrate top side and coupled to the one or more conductive paths of the substrate;
   a mold layer comprising a mold layer top side and a mold layer bottom side, wherein the mold layer surrounds the electrical component;
   a cavity in the mold layer top side, wherein the cavity exposes at least a portion of the electrical component; and
   a conductive via structure that passes through the mold layer, wherein the conductive via structure comprises a lower end coupled to the substrate and an upper end exposed at the mold layer top side.

2. The semiconductor device of claim 1, further comprising a lid over the cavity, wherein the lid is coupled to the upper end of the conductive via structure.

3. The semiconductor device of claim 2, wherein the conductive via structure comprises a conductive pillar coupled to the lid and the substrate.

4. The semiconductor device of claim 2, wherein the electrical component is configured to interact through the lid with an environment external to the semiconductor device.

5. The semiconductor device of claim 2, wherein the electrical component is configured to detect radiation received through the lid.

6. The semiconductor device of claim 2, wherein the electrical component is configured to emit radiation through the lid.

7. The semiconductor device of claim 2, wherein the lid comprises a polymer substrate.

8. The semiconductor device of claim 2, wherein the lid comprises a metal substrate.

9. The semiconductor device of claim 1, further comprising:
   interconnects along the substrate bottom side;
   wherein the interconnects are coupled to the electrical component by way of the substrate.

10. The semiconductor device of claim 1, wherein the conductive via structure is cylindrical.

11. A semiconductor device, comprising:
    a substrate comprising a substrate top side, a substrate bottom side, and one or more conductive paths;
    an electrical component mounted to the substrate top side and coupled to the one or more conductive paths of the substrate;
    a polymer material surrounding the electrical component;
    a conductive via structure comprising an upper end and a lower end, wherein the lower end of the conductive via structure is coupled to the substrate top side; and
    a lid over the electrical component and the polymer material, wherein the lid is coupled to the upper end of the conductive via structure.

12. The semiconductor device of claim 11, wherein the electrical component is configured to interact through the lid with an environment external to the semiconductor device.

13. The semiconductor device of claim 11, wherein the electrical component is configured to detect radiation received through the lid.

14. The semiconductor device of claim 11, wherein the electrical component is configured to emit radiation through the lid.

15. The semiconductor device of claim 11, wherein the polymer material contacts at least a portion of the electrical component.

16. The semiconductor device of claim 11, further comprising:
    interconnects along the substrate bottom side;
    wherein the interconnects are coupled to the electrical component by way of the substrate.

* * * * *